United States Patent
Wang et al.

(10) Patent No.: US 7,378,310 B1
(45) Date of Patent: May 27, 2008

(54) METHOD FOR MANUFACTURING A MEMORY DEVICE HAVING A NANOCRYSTAL CHARGE STORAGE REGION

(75) Inventors: Connie Pin-Chin Wang, Mountain View, CA (US); Zoran Krivokapic, Santa Clara, CA (US); Suzette Keefe Pangrle, Cupertino, CA (US); Robert Chiu, San Jose, CA (US); Lu You, San Jose, CA (US)

(73) Assignees: Spansion LLC, Sunnyvale, CA (US); Advanced Micro Devices, Inc., Sunnyvale, CA (US)

( * ) Notice: Subject to any disclaimer, the term of this patent is extended or adjusted under 35 U.S.C. 154(b) by 318 days.

(21) Appl. No.: 11/116,551

(22) Filed: Apr. 27, 2005

(51) Int. Cl.
*H01L 21/8242* (2006.01)
(52) U.S. Cl. ............... 438/240; 438/85; 438/575; 438/582; 257/E51.007; 257/E29.013; 257/E29.015; 257/E29.02
(58) Field of Classification Search ............... 438/240
See application file for complete search history.

(56) References Cited

U.S. PATENT DOCUMENTS

| | | | |
|---|---|---|---|
| 5,852,306 A | 12/1998 | Forbes | |
| 5,959,896 A | 9/1999 | Forbes | |
| 6,060,743 A | 5/2000 | Sugiyama et al. | |
| 6,262,129 B1 | 7/2001 | Murray et al. | |
| 6,391,769 B1* | 5/2002 | Lee et al. | 438/643 |
| 6,723,606 B2 | 4/2004 | Flagan et al. | |
| 6,774,061 B2 | 8/2004 | Coffa et al. | |
| 6,780,242 B2 | 8/2004 | Norris | |
| 2001/0040271 A1* | 11/2001 | Duncombe et al. | 257/532 |
| 2002/0061646 A1 | 5/2002 | Kan et al. | |
| 2002/0192949 A1 | 12/2002 | Kan et al. | |
| 2003/0010987 A1 | 1/2003 | Banin et al. | |
| 2003/0025133 A1 | 2/2003 | Brousseau, III | |
| 2003/0077863 A1 | 4/2003 | Choi et al. | |
| 2003/0102793 A1* | 6/2003 | Komoda et al. | 313/311 |
| 2004/0002195 A1 | 1/2004 | Brousseau, III | |

(Continued)

OTHER PUBLICATIONS

Zengtao Liu, Chungho Lee, Venkat Narayanan, Gen Pei, and Edwin Chihchuan Kan, Metal Nanocrystal Memories—Part I: Device Design and Fabrication, IEEE Transactions on Electron Devices, vol. 49, No. 9, pp. 1606-1613, Sep. 2002.

(Continued)

*Primary Examiner*—Walter Lindsay, Jr.
*Assistant Examiner*—Abdulfattah Mustapha
(74) *Attorney, Agent, or Firm*—Farjami & Farjami LLP

(57) ABSTRACT

A method for manufacturing a memory device having a metal nanocrystal charge storage structure. A substrate is provided and a first layer of dielectric material is grown on the substrate. A layer of metal oxide having a first heat of formation is formed on the first layer of dielectric material. A metal layer having a second heat of formation is formed on the metal oxide layer. The second heat of formation is greater than the first heat of formation. The metal oxide layer and the metal layer are annealed which causes the metal layer to reduce the metal oxide layer to metallic form, which then agglomerates to form metal islands. The metal layer becomes oxidized thereby embedding the metal islands within an oxide layer to form a nanocrystal layer. A control oxide is formed over the nanocrystal layer and a gate electrode is formed on the control oxide.

20 Claims, 1 Drawing Sheet

U.S. PATENT DOCUMENTS

| | | |
|---|---|---|
| 2004/0118698 A1 | 6/2004 | Lu et al. |
| 2004/0130941 A1 | 7/2004 | Kan et al. |
| 2004/0130951 A1 | 7/2004 | Forbes |
| 2004/0180491 A1* | 9/2004 | Arai et al. .................. 438/200 |
| 2005/0014335 A1 | 1/2005 | Goldbach et al. |
| 2006/0118805 A1* | 6/2006 | Camras et al. ................ 257/98 |

OTHER PUBLICATIONS

Zengtao Liu, Chungho Lee, Venkat Narayanan, Gen Pei, and Edwin Chihchuan Kan, Metal Nanocrystal Memories—Part II: Electrical Characteristics, IEEE Transactions on Electron Devices, vol. 49, No. 9, pp. 1614-1622, Sep. 2002.

M. Takata, S. Kondoh, T. Sakaguchi, H. Choi, J-C. Shim, H. Kurino and M. Koyanagi, New Non-Volatile Memory with Extremely High Density Metal Nano-Dots, Technical Digest, 2003 IEEE International Electron Devices Meeting, Washington DC, pp. 553-556.

* cited by examiner

METHOD FOR MANUFACTURING A MEMORY DEVICE HAVING A NANOCRYSTAL CHARGE STORAGE REGION

FIELD OF THE INVENTION

This invention relates, in general, to memory devices and, more particularly, to memory devices having metal nanocrystals in a charge storage region.

BACKGROUND OF THE INVENTION

Memory devices are used in a variety of electronic systems including computers, cellular phones, pagers, personal digital assistants, avionic systems, automotive systems, industrial control systems, appliances, etc. Depending on the particular system configuration, the memory devices may be either non-volatile or volatile. A non-volatile memory device retains the data or instructions when the device is turned off or power is removed. A volatile memory device, on the other hand, does not retain the stored data or instructions when the device is turned off. Flash memory has become an important type of non-volatile memory because it is less expensive to manufacture and has a higher device density than most other types of memory devices. In addition, Flash memory is electrically erasable and has a life span of up to one million write cycles.

As semiconductor device manufacturers shrink memory devices such as Flash memories and Dynamic Random Access Memories (DRAM's), the charge storage area in these devices decreases resulting in fewer stored electrons. One technique for increasing the number of stored electrons has been to incorporate nanocrystals in the charge storage region of a memory device. FIG. 1 illustrates a prior art memory device 10 having a layer of nanocrystal material disposed in the charge storage region. What is shown in FIG. 1 is a semiconductor substrate 12 on which a gate structure 14 is formed. Gate structure 14 includes a gate conductor 22 disposed on a dielectric stack comprising a tunnel oxide layer 16, a metal nanocrystal layer 18, and a control oxide layer 20. Source and drain regions 24 and 26, respectively, are formed in the portions of substrate 12 adjacent gate structure 14. Metal nanocrystal layer 18 is formed by depositing a thin metal layer on tunnel oxide layer 16 and annealing the metal at high temperatures to cause the metal to agglomerate. Each metal agglomerate is a nanocrystal. The thin metal layer from which the nanocrystals are formed is typically gold, platinum silicide, silver, or nickel.

A drawback with this procedure is that the agglomeration process is random, thus there is a large variation in the size and spacial distribution of the nanocrystals. In addition, the mean size of the nanocrystal is sensitive to the local temperature and metal film thickness, making it difficult to control their size distribution on large diameter semiconductor wafers. Because the threshold voltage ($V_t$) is dependent on the size of the nanocrystals, a large variation in nanocrystal size results in a large variation in the threshold voltage across the semiconductor wafer. Another drawback is that formation of the control oxide layer oxidizes the nanocrystals, which degrades their charge storage capacities. Other drawbacks of using the agglomeration process include the cost and complexity of using metals such as gold, platinum silicide, silver, and nickel to form the thin metal layer and the inability of the control oxide to sufficiently fill the spaces between small dimension nanocrystals.

Accordingly, it would be advantageous to have a method for manufacturing a charge storage structure having nanocrystals with a uniform size and that limits the oxidation of the nanocrystals. It would be of further advantage for the structure and method to be cost and time efficient and compatible with memory device manufacturing processes.

SUMMARY OF THE INVENTION

The present invention satisfies the foregoing need by providing a method for manufacturing a memory device having a metal nanocrystal charge storage region. In accordance with one embodiment, the present invention includes providing a substrate and forming a first layer of dielectric material on the substrate. A layer of metal oxide having a first heat of formation is formed on the first layer of dielectric material. A metal having a second heat of formation is formed on the layer of metal oxide. The second heat of formation of the metal is greater than the first heat of formation. The metal and the layer of metal oxide are annealed.

In accordance with another embodiment, the present invention comprises a method for manufacturing a memory device having a metal nanocrystal charge storage region. A dielectric material is provided and a layer of metal oxide is formed on the dielectric material. A layer of metal is formed on the layer of metal oxide and a portion of the layer of metal oxide is reduced using the layer of metal.

In accordance with yet another embodiment, the present invention includes a method for manufacturing a memory element, comprising providing a metal oxide layer having a first heat of formation. A metal layer having a second heat of formation is formed on the metal oxide layer, wherein the second heat of formation is greater than the first heat of formation. A nanocrystal layer is formed from the metal oxide layer and the metal layer.

BRIEF DESCRIPTION OF THE DRAWINGS

The present invention will be better understood from a reading of the following detailed description, taken in conjunction with the accompanying drawing figures, in which like reference numbers designate like elements, and in which.

DETAILED DESCRIPTION

Generally, the present invention provides a method for manufacturing a memory device having a nanocrystal layer in which the nanocrystals have a uniform size and a uniform distribution. An advantage of the nanocrystal layer of the present invention is that it can be used in applications where it is desirable to have dielectric materials with high dielectric constants, i.e., dielectric constants greater than about 3.9. In accordance with an embodiment of the present invention, a metal oxide layer is formed on a tunnel oxide, and a metal layer is formed on the metal oxide layer. The metal layer is selected to have a higher heat of formation than the metal oxide layer so that under annealing conditions it reduces the metal oxide layer to metallic form which then agglomerates to form metal islands. In addition, the metal layer becomes oxidized thereby embedding the metal islands within an oxide layer to form a nanocrystal layer.

Figure 1:
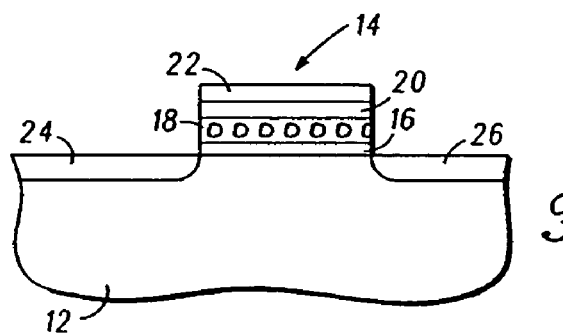
FIG. 1 is a cross-sectional side view of a prior art memory device.
Figure 2:
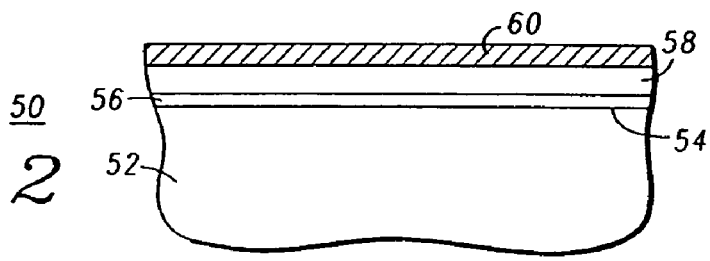
FIG. 2 is cross-sectional side view of a memory device at an early stage of manufacture in accordance with an embodiment of the present invention.

FIG. 2 is an enlarged cross-sectional side view of a portion of a partially completed memory device 50 during processing in accordance with an embodiment of the present invention. What is shown in FIG. 2 is a semiconductor substrate 52 having a major surface 54. Suitable materials for substrate 52 include silicon, germanium, Semiconductor-On-Insulator (SOI), silicon germanium, gallium arsenide, indium phosphide, other compound semiconductor materials, or the like. The semiconductor material may also be a semiconductor substrate having an epitaxial layer formed thereon. A layer of dielectric material 56 having a thickness ranging from about 20 Angstroms (Å) to about 50 Å is formed on substrate 52. By way of example, layer of dielectric material 56 is oxide grown by dry oxidation. It should be noted that the type of dielectric material for dielectric layer 56 and the technique for forming dielectric layer 56 are not limitations of the present invention.

A layer of metal oxide 58 having a thickness ranging from about a monolayer to about 150 Å is formed on oxide layer 56. Suitable metal oxides include nickel oxide (NiO), cobalt oxide (CoO), tungsten oxide ($WO_3$), silver oxide (AgO or $Ag_2O$), ruthenium oxide ($RuO_2$), chromium oxide ($Cr_2O_3$), iron oxide ($Fe_2O_3$), or the like. Preferably, the oxides are those with a small absolute value of heat of formation, i.e., oxides that are easily reduced. Metal oxide layer 58 can be formed using Atomic Layer Deposition (ALD), evaporation, Radio Frequency (RF) sputtering, Chemical Vapor Deposition (CVD), or the like. In accordance with one embodiment, metal oxide layer 58 is formed by depositing a metal such as, for example, nickel on dielectric layer 56 using Plasma Vapor Deposition (PVD). The nickel is oxidized under an oxygen annealing ambient to form metal oxide layer 58.

A metal layer 60 having a thickness of at least half of layer 58 is formed on metal oxide layer 58. Suitable metals for metal layer 60 include aluminum, hafnium, zirconium, tantalum, strontium, titanium, strontium-titanium alloy, barium, barium-titanium alloy, or the like. The metal of metal layer 60 may or may not be the same as the metal of metal oxide layer 58. In other words, layer of metal oxide 58 may be nickel oxide and metal layer 60 may be aluminum or layer of metal oxide 58 may be aluminum oxide and metal layer 60 may be aluminum. The metal of metal layer 60 has a higher heat of formation than metal oxide layer 58.

Figure 3:
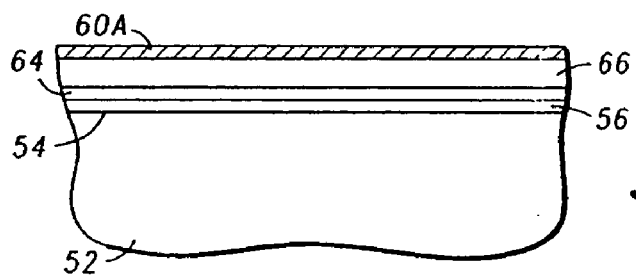
FIG. 3 is a cross-sectional side view of the memory device of FIG. 2 at a later stage of manufacture.

Referring now to FIG. 3, layer of metal oxide 58 and metal layer 60 are annealed to transform layers 58 and 60 into a nanocrystal layer 70 (shown in FIG. 4) in which nanocrystals 72 are embedded. In an embodiment where metal layer 60 has a thickness of more than one-half the thickness of layer 58, layers 58 and 60 are preferably annealed in a reducing environment such as, for example, an ammonia ambient, or an ambient comprising a combination of hydrogen and nitrogen, or in a vacuum. Once in the reducing environment, the ambient is preferably heated to a temperature of at least about 250 degrees Celsius (° C.). Even more preferably, the ambient is heated to a temperature ranging from about 250° C. to about 1,000° C. for a time ranging from about 30 seconds to about 30 minutes. Alternatively, the ambient is heated to a temperature ranging from about 250° C. to about 600° C. for a time ranging from about 30 seconds to about 30 minutes. During the annealing step, metal layer 60 reduces metal oxide layer 58 to form a reduced thin metal layer 64 and a dielectric layer 66. In other words, metal oxide layer 58 is reduced to form a thin metal layer 64 and a portion of metal layer 60 is oxidized to form a dielectric layer 66 having a dielectric constant greater than about 3.9. A portion 60A of metal layer 60 may remain unoxidized after oxidation of metal layer 60 or all of metal layer 60 may be oxidized.

In an alternative embodiment where metal layer 60 has a thickness close to that of layer 58 or less than about 150 Å, layers 58 and 60 are placed in an oxygen base ambient and the ambient is heated to a temperature ranging from about 250° C. to about 1,000° C. for a time ranging from about 30 seconds to about 30 minutes. The oxidizing environment oxidizes metal layer 60. As the oxidation progresses, metal layer 60 reduces metal oxide layer 58 to form a reduced thin metal layer 64 and dielectric layer 66. In other words, metal oxide layer 58 is reduced to form a thin metal layer 64 and a portion of metal layer 60 is oxidized to form a dielectric layer 66 having a dielectric constant greater than about 3.9. Like the embodiment in which metal layer 60 has a thickness of more than one-half the thickness of layer 58, portion 60A of metal layer 60 may remain after oxidation of metal layer 60 or all of metal layer 60 may be oxidized.

Figure 4:
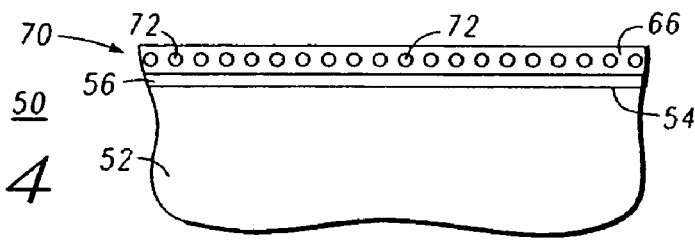
FIG. 4 is a cross-sectional side view of the memory device of FIG. 3 at a later stage of manufacture.

Referring now to FIG. 4, semiconductor component 50 is illustrated at a later stage of the annealing step. At temperatures greater than about 250° C., reduced thin metal layer 64 agglomerates forming nanocrystals 72 which are embedded within dielectric layer 66 to form a nanocrystal layer 70. Nanocrystals 72 of layer 70 have a crystalline size ranging from about 1 nanometer to about 20 nanometers (nm). In accordance with an embodiment of the present invention, metal oxide layer 58 is nickel oxide (NiO) and metal layer 60 is aluminum (Al). In this embodiment, reduced thin metal layer 64 is nickel oxide, nanocrystals 72 are nickel, and dielectric layer 66 is aluminum oxide ($Al_2O_3$). In accordance with another embodiment of the present invention, metal oxide layer 58 is nickel oxide (NiO) and metal layer 60 is hafnium (Hf). Here, reduced thin metal layer 64 is nickel oxide, nanocrystals 72 are nickel, and dielectric layer 66 is aluminum oxide ($Al_2O_3$).

Portion 60A of metal layer 60, i.e., the unreacted portion of metal layer 60 shown in FIG. 3, is removed or stripped away using either a wet etch or a dry etch.

Figure 5:
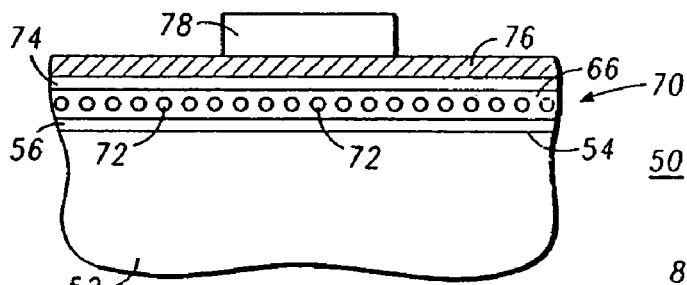
FIG. 5 is a cross-sectional side view of the memory device of FIG. 4 at a later stage of manufacture.

Referring now to FIG. 5, a layer of dielectric material 74 having a thickness ranging from about 70 Å to about 200 Å is disposed on nanocrystal layer 70. The thickness of dielectric layer 74 is selected in accordance with its dielectric constant. Thus, if the dielectric material has a low dielectric constant, a thin dielectric layer may be suitable. If the dielectric material has a high dielectric constant, a thicker dielectric material may be more suitable. By way of example, layer of dielectric material 74 is oxide that is deposited using plasma enhanced chemical vapor deposition (PECVD). It should be noted that the type of dielectric material for dielectric layer 74 and the technique for forming dielectric layer 74 are not limitations of the present invention.

A layer of conductive material 76 is formed on dielectric layer 74. In accordance with one embodiment, conductive layer 76 is a metal layer formed using a reactive sputtering method. Suitable metals include metal nitrides such as, for example, tantalum nitride (TaN), titanium nitride (TiN), tungsten nitride (WN), molybdenum nitride (MoN), zirconium nitride (ZrN), hafnium nitride (HfN), or the like. In addition, conductive layer 76 may be comprised of metals having work functions near the valence band. Examples of these types of metals include nickel (Ni), platinum (Pt), ruthenium (Ru), ruthenium oxide ($RuO_2$), or the like. In accordance with another embodiment, conductive layer 76 is a metal layer formed by using CVD or ALD. Suitable metals for CVD deposition include, but are not limited to, tungsten (W), molybdenum (Mo), tantalum nitride (TaN), tantalum silicon nitride (TaSiN), or the like. In accordance with yet another embodiment, conductive layer 76 is a polysilicon layer such as for example, a p-type doped polysilicon layer. A layer of photoresist is formed on conductive layer 76 and patterned to form an etch mask 78.

Figure 6:
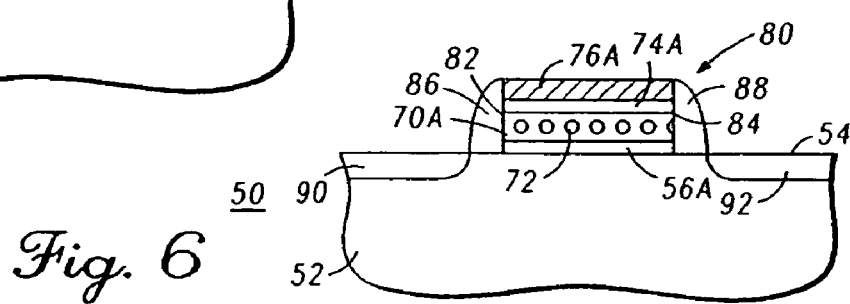
FIG. 6 is a cross-sectional side view of the memory device of FIG. 5 at a later stage of manufacture.

Referring now to FIG. 6, the portions of conductive layer 76, dielectric layer 74, nanocrystal layer 70, and oxide layer 56 not protected by etch mask 78 are anisotropically etched to form a gate structure 80 having sidewalls 82 and 84. By way of example, layers 76, 74, 70, and 56 are etched using reactive ion etching, wherein substrate 52 serves as an etch stop layer. After the anisotropic etch step, portion 56A of oxide layer 56 remains and serves as a tunnel oxide; portion 70A of nanocrystal layer 70 remains and serves as a metal nanocrystalline charge storage layer; portion 74A of oxide layer 74 remains and serves as a control oxide; and portion 76A of conductive layer 76 remains and serves as a gate conductor.

Still referring to FIG. 6, sidewall spacers 86 and 88 are formed along sidewalls 82 and 84, respectively. Source and drain regions 90 and 92 are formed in the portions of substrate 52 adjacent spacers 86 and 88, respectively. Although not shown, it should be understood that source and drain extension regions, halo regions, or combinations thereof may also be formed in memory device 50.

By now it should be appreciated that a method for manufacturing a memory device has been provided, wherein the memory device includes a metal nanocrystal charge storage structure. An advantage of the present invention is that the size of the nanocrystals across the wafer is well controlled, which results in the memory device having a well controlled threshold voltage ($V_t$). In addition, the metal nanocrystals made in accordance with the present invention are resistant to oxidation. The present invention also offers the advantage of using a greater variety of metals to form the nanocrystals. For example, the nanocrystals can be formed from materials such as titanium nitride (TiN), tungsten (W), and tantalum nitride (TaN) which allow use of higher temperature processing because of their higher melting temperature. What's more, metals like silver, gold, platinum silicide, and nickel can also be used to form the nanocrystals.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a memory device, comprising:
   providing a substrate;
   forming a first layer of dielectric material on the substrate;
   forming a layer of metal oxide on the first layer of dielectric material, the layer of metal oxide having a first heat of formation;
   forming a metal layer on the layer of metal oxide, the metal layer having a second heat of formation, the second heat of formation greater than the first heat of formation; and
   annealing the metal layer and the layer of metal oxide to form a nanocrystal layer.

2. The method of claim 1, wherein the forming layer of metal oxide includes using a metal oxide selected from the group of metal oxides consisting of nickel oxide, cobalt oxide, tungsten oxide, ruthenium oxide, and silver oxide.

3. The method of claim 2, wherein forming the metal layer on the layer of metal oxide includes using a metal selected from the group of metals consisting of aluminum, hafnium, zirconium, and tantalum.

4. The method of claim 2, wherein forming the layer of metal oxide includes forming the layer of metal oxide using a technique selected from the group of techniques comprising atomic layer deposition, evaporation, radio frequency sputtering, and chemical vapor deposition.

5. The method of claim 1, wherein forming the layer of metal oxide comprises:
   forming a layer of metal on the first layer of dielectric material; and
   oxidizing the layer of metal to form the layer of metal oxide.

6. The method of claim 5, wherein forming the layer of metal includes forming the layer of metal using a plasma vapor deposition technique and wherein oxidizing the layer of metal includes annealing the layer of metal in an oxygen ambient.

7. The method of claim 6, wherein forming the layer of metal includes depositing a layer of nickel and wherein oxidizing the layer of metal forms nickel oxide.

8. The method of claim 1, wherein annealing the metal layer and the layer of metal oxide includes annealing the metal layer and the layer of metal oxide in a vacuum.

9. The method of claim 1, wherein annealing the metal layer and the layer of metal oxide includes annealing the metal layer and the layer of metal oxide in one of a nitrogen or an oxygen ambient.

10. The method of claim 1, wherein annealing the metal layer and the layer of metal oxide includes annealing the metal layer and the layer of metal oxide at a temperature ranging from about 250 degrees Celsius (° C.) to about 600° C.

11. The method of claim 1, wherein annealing the metal layer and the layer of metal oxide converts a portion of the metal layer to metal oxide and further including removing portions of the metal layer.

12. A method for manufacturing a nanocrystal memory device, comprising:
   providing a dielectric material;
   forming a layer of metal oxide on the dielectric material;
   forming a layer of metal on the layer of metal oxide; and
   reducing a portion of the layer of metal oxide using the layer of metal so as to form a nanocrystal layer.

13. The method of claim 12, wherein reducing the portion of the layer of metal oxide includes annealing the layer of metal oxide and the layer of metal in one of a nitrogen ambient or a vacuum.

14. The method of claim 12, wherein reducing the portion of the layer of metal oxide includes oxidizing the layer of metal.

15. The method of claim 12, wherein forming the layer of metal oxide comprises forming the layer of metal oxide using a precursor selected from the group of precursors comprising nickel oxide, cobalt oxide, tungsten oxide, ruthenium oxide, and silver oxide.

16. The method of claim 12, wherein forming the layer of metal comprises forming the layer of metal using a metal selected form the group of metals consisting of aluminum, hafnium, zirconium, and tantalum.

17. The method of claim 12, wherein reducing the portion of the layer of metal oxide using the layer of metal includes annealing at a temperature ranging from about 250 degrees Celsius (° C.) to about 600° C.

18. The method for manufacturing a memory element, comprising:

provifing a metal oxide layer having a first heat of formation;

forming a metal layer on the metal oxide layer, the metal layer having a second heat of formation, which is greater than the first heat of formation; and forming a nanocrystal layer from the metal oxide layer and the metal layer, the nanocrystal layer comprising at least one metal nanocrystal.

19. The method of claim 18, wherein forming the nanocrystal layer includes using the metal layer to reduce the meal oxide layer.

20. The method of claim 18, wherein forming the nanocrystal layer includes using heat at a temperature of at least about 250 degrees Celsius.

* * * * *